United States Patent [19]
Petri

[11] Patent Number: 5,331,242
[45] Date of Patent: Jul. 19, 1994

[54] VIBRATING TINE RESONATORS AND METHODS FOR TORSIONAL AND NORMAL DYNAMIC VIBRATING MODE

[75] Inventor: Fred Petri, Snohomish, Wash.

[73] Assignee: AlliedSignal Inc., Morris Township, Morris County, N.J.

[21] Appl. No.: 978,114

[22] Filed: Nov. 18, 1992

[51] Int. Cl.⁵ .................................... H03H 9/215
[52] U.S. Cl. .................................. 310/370; 310/366
[58] Field of Search .................... 310/366, 367, 370

[56] References Cited
U.S. PATENT DOCUMENTS

| | | | |
|---|---|---|---|
| 4,368,402 | 1/1983 | Torii et al. | 310/367 |
| 4,450,378 | 5/1984 | Hermann et al. | 310/367 |
| 4,469,979 | 9/1984 | Chuang | 310/370 |
| 4,654,663 | 3/1987 | Alsenz et al. | 310/360 |
| 4,757,228 | 7/1988 | Kalinoski et al. | 310/366 |
| 4,773,493 | 9/1984 | Goodier | 177/210 F P |
| 4,873,465 | 10/1989 | Bourgeois | 310/367 |
| 4,929,860 | 5/1990 | Hulsing et al. | 310/366 |

FOREIGN PATENT DOCUMENTS

| | | | |
|---|---|---|---|
| 0021679 | 2/1980 | Japan | 310/370 |
| 0260310 | 10/1988 | Japan | 310/367 |
| 0311810 | 12/1988 | Japan | 310/367 |

Primary Examiner—Thomas M. Dougherty
Attorney, Agent, or Firm—Howard G. Massung

[57] ABSTRACT

A vibrating tine resonator having a unitary body cut from flat, planar crystalline stock includes spaced apart end portions and a tine system extending between said portions. The tine system includes a pair of similar tine arrays extending side-by-side between base portions. Each array includes a pair of tines extending parallel to one another and defining a slot separating each adjacent pair of tines. Each array also includes a bridge portion spanning the slot and joining the tines. The resonator is excited to operate in a dynamic mode including both a torsional motion component and also a normal motion component. The bridge portion interconnecting adjacent tines is pivoted around an axis parallel with the tines. The tines are also moved to vibrate in directions normal to the flat plane of the resonator body.

25 Claims, 2 Drawing Sheets

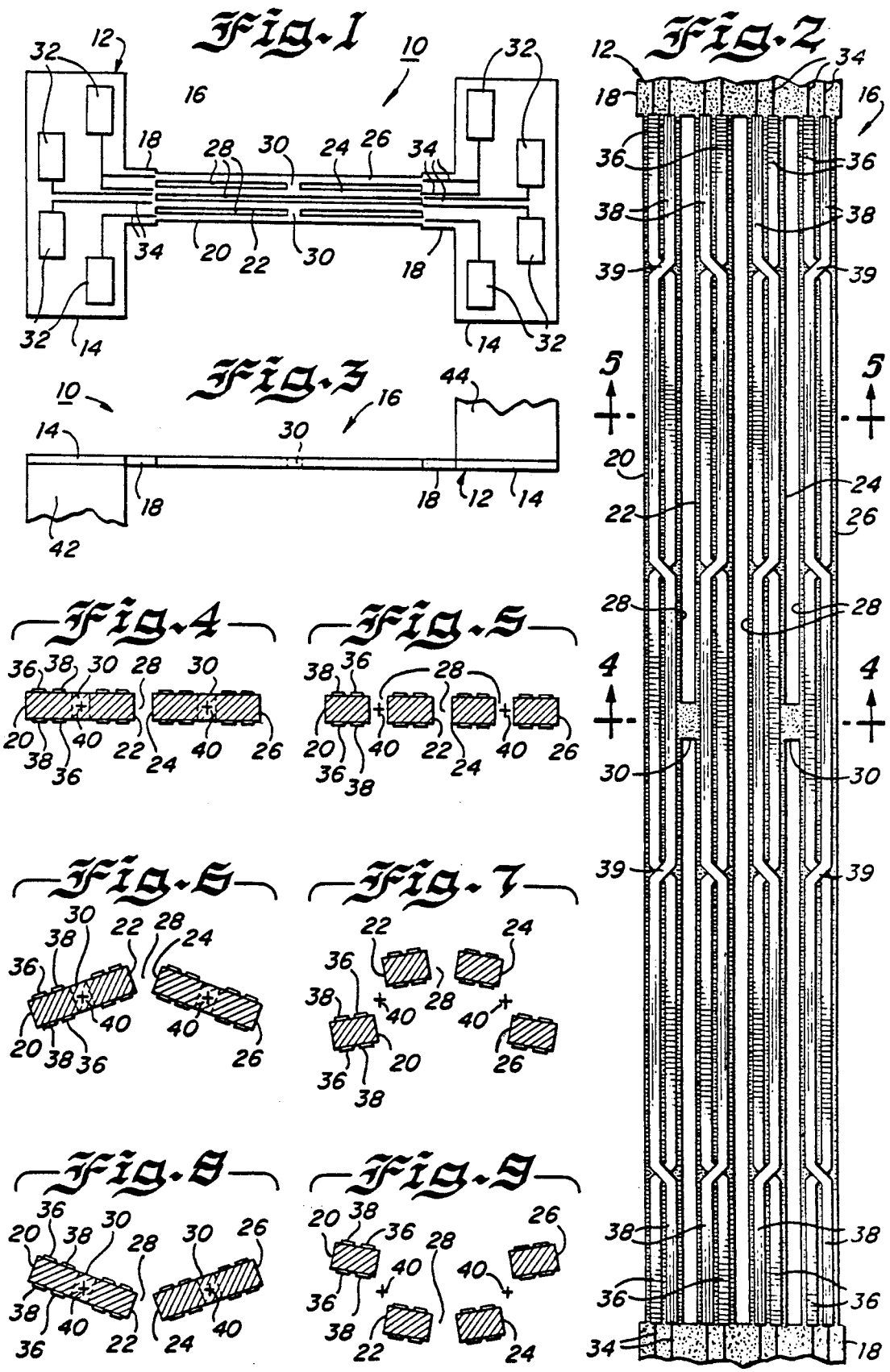

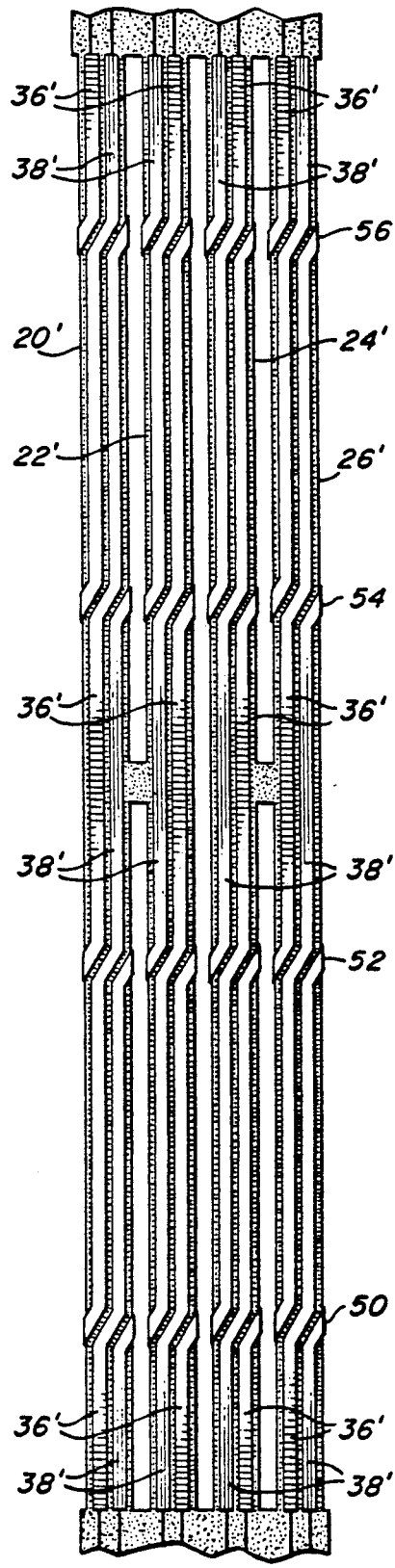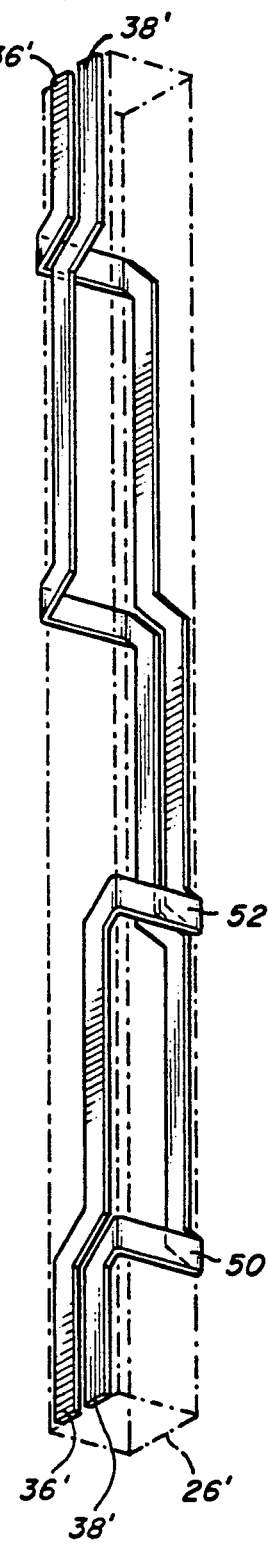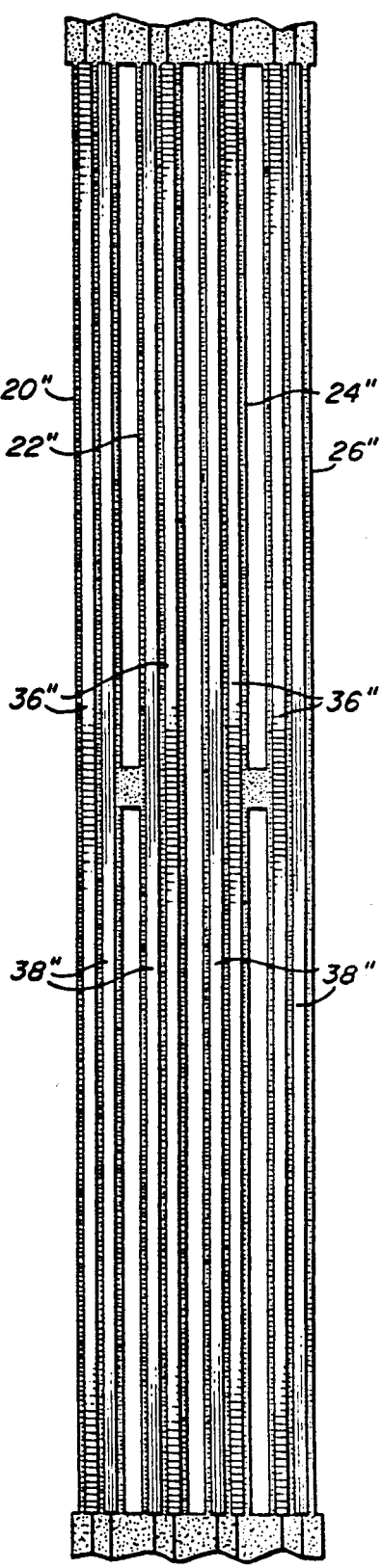

VIBRATING TINE RESONATORS AND METHODS FOR TORSIONAL AND NORMAL DYNAMIC VIBRATING MODE

BACKGROUND OF THE INVENTION

1. Field of the Invention

This invention relates to improvements in vibrating tine resonators useful as force transducers or the like and, more particularly, to resonators having an improved tine system and to structure and methods for operating the resonator in a dynamic mode including torsional and normal components.

2. Description of the Prior Art

Resonators with tines or beams have been used as frequency determining elements in electronic oscillator circuits. A characteristic of such devices is that the resonant frequency at which they vibrate varies in response to an applied force such as an axial force applied to the tines. This characteristic has been exploited by using resonating tine devices as transducers to measure parameters including acceleration, force, temperature, pressure and weight.

In a typical transducer implementation, the resonator may be made of a piezoelectric material such as crystalline quartz, and electrodes applied to the tines couple the resonator to an oscillator feedback circuit. Energy applied by the electrodes excites the resonator to vibrate at a resonant frequency. Frequency variations indicating changes in the measured parameter are detected to provide an output for instrumentation, control or the like. Alternatively, the resonator may be made of silicon and driven electrostatically or electromagnetically.

To provide for balancing of forces within the resonating device, one common configuration for a resonator is a double ended tuning fork (DETF) having a pair of spaced and parallel tines or beams fixed at opposite ends to integral end portions. A slot separates the beams, and a crotch is defined at each end portion where the beams terminate. Each tine is mechanically coupled to the other by forces communicated between the ends of the tines through the end portions. The result is that the tines vibrate in sympathetic motion at the same frequency, but in opposite, out-of-phase directions. Resonators with more than two tines, and many different structural features such as shoulders, notches, added masses and the like have been proposed to increase the efficiency of vibrating tine structures.

Vibrating tine resonators are typically made from a flat sheet or web of crystal material, often piezoelectric quartz. When quartz is used, the electrodes are usually bonded to the tines to apply electrical potentials resulting in piezoelectric forces in the quartz material. If a different material such as silicon is used, electromagnetic or electrostatic electrodes may be used. Normally, the electrodes are arrayed to cause the tines to vibrate in the plane of the sheet material from which the device is formed.

U.S. Pat. No. 4,469,979 discloses a DETF resonator in which electrodes are disposed on all four surfaces of each tine. The electrodes are deployed to optimize a desired fundamental or harmonic flexure mode. U.S. Pat. No. 4,773,493 discloses DETF resonators with rotational masses coupled to nodal points along the length of the tines to influence the tines to resonate at the intended measurement frequency.

Resonators employed in the past are subject to problems. When the tines vibrate in the plane of the stock in air or another gaseous atmosphere, gas is forced from between adjacent tines as they move toward one another and then is pulled or sucked into the space between the tines as they separate from one another. This effect, called gas pumping or air pumping, results in loss of energy, reducing the Q and the efficiency of the resonator. Q is the ratio of energy stored in the resonator in each cycle of vibration to the energy lost per cycle. Because the value of the ratio Q is directly proportional to the gain and thus the sensitivity of the crystal controlled oscillator, the reduction of Q due to gas pumping is undesirable. Gas pumping can also decrease the linearity of the system because of inconsistent resistance to tine motion. Although the disadvantageous effects of gas pumping can be avoided by operating the device in a vacuum, this may not be a practical or cost effective solution.

In the case of quartz resonators, the array of electrodes used to piezoelectrically drive the tines in the plane of the stock usually includes electrodes on the sides of the tines. While it is relatively easier to form electrodes on the outwardly facing surfaces of the stock, it is more difficult and expensive to form electrodes upon the side surfaces. One reason for the difficulty is the limited space between adjacent tines.

It has been proposed to use three tines in a resonator in an attempt to decrease the loss of energy resulting from coupling unbalanced reaction forces to the support for the resonator, and in an attempt to increase to maximum axial force measurement capability. A three tine device has disadvantages including difficulty in manufacture due to critical beam mass balancing requirements.

SUMMARY

A principle object of the present invention is to provide a resonator and method for vibrating the resonator capable of achieving an improved dynamic oscillation mode. Other and related objects are to provide a resonator and method in which disadvantageous air pumping is avoided; to provide a resonator and method in which electrodes on side surfaces of the tines are not required; to provide a resonator and method in which the mechanical stresses induced during vibration are reduced; to provide a higher mode of operation thus increasing the Q of the device; to provide a resonator and method resulting in a reduction in reaction forces coupled from the resonator to its support; to provide an economically manufactured resonator and method with a large maximum force capability; and to provide a resonator and method overcoming disadvantages of those known in the past.

In brief, the above and other objects and advantages of the invention are achieved by providing a vibrating tine resonator having a unitary body cut from flat, planar crystalline stock and having a generally uniform thickness. The body includes spaced apart end portions and a tine system extending between the end portions. The tine system includes a pair of similar tine arrays extending side by side between the end portions. Each array includes a pair of tines extending parallel to one another and defining a slot separating the pair of tines. Each array also includes a bridge portion spanning the slot and joining the tines.

In accordance with the invention, the resonator is excited to operate in dynamic mode including both a torsional motion component and also a normal motion component. A bridge portion interconnecting an adjacent pair of tines is pivoted around an axis parallel with the tines. The tines are moved to vibrate in directions normal to the flat plane of the resonator body.

BRIEF DESCRIPTION OF THE DRAWING

These and other objects and advantages of the present invention will become readily apparent upon consideration of the following detailed description and attached drawing, wherein:

FIG. 1 is a plan view of one of the two opposed major surfaces of a resonator constructed in accordance with the present invention;

FIG. 2 is an enlarged, fragmentary plan view of the tine system of the resonator of FIG. 1 showing the location of electrodes on the tines;

FIG. 3 is a fragmentary and simplified side view showing the resonator of FIG. 1 used for measuring acceleration;

FIG. 4 is a greatly enlarged sectional view taken along line 4—4 of FIG. 2 showing the position of a central portion of the tine system when the resonator is at rest;

FIG. 5 is a greatly enlarged sectional view taken along line 5—5 of FIG. 2 showing the position of another portion of the tine system when the resonator is at rest;

FIG. 6 is a view like FIG. 4 showing the position of the illustrated portion of the tine system at a given point during a cycle of vibration;

FIG. 7 is a view like FIG. 5 showing the position of the illustrated portion of the tine system at the same point seen in FIG. 6;

FIG. 8 is a view like FIG. 6 showing the position of the same portion of the tine system at a complementary opposite phase point in the cycle;

FIG. 9 is a view like FIG. 7 showing the position of the same portion of the tine system at a complementary, opposite phase point in the cycle;

FIG. 10 illustrates an alternative electrode pattern usable with the resonator according to the invention;

FIG. 11 is an enlarged fragmentary perspective view showing one of the tines and a portion of the electrode pattern of FIG. 10; and FIG. 12 is yet another electrode pattern usable with the resonator according to the invention.

DETAILED DESCRIPTION OF THE PREFERRED EMBODIMENT

Referring now to the drawings, in FIG. 1 there is illustrated a resonator generally designated as 10 and constructed in accordance with the principles of the present invention. The resonator 10 is unitary and made by cutting a resonator body 12 from a flat planar sheet or web of crystalline stock having a substantially uniform thickness. In the illustrated embodiment of the invention, the body 12 is a flat sheet of crystalline quartz from which the resonator is cut by a known fabrication process such as photolithographic masking with anisotropic, wet chemical etching. Other processes such as ultrasonic milling, waterjet cutting or the like may be used.

The resonator 10 has a pair of enlarged, spaced apart end mounting sections 14. A tine system generally designated as 16 is integral with and extends between the end sections 14. The tine system includes a pair of base portions 18 adjacent the mounting sections 14. Four tines 20, 22, 24 and 26 extend between the base portions 18. A slot 28 separates each adjacent pair of tines 20-26. Two of the three slots 28 are interrupted by a bridge portion 30 of body 12. One bridge portion 30 interconnects tines 24 and 26. Tines 22 and 24 are not interconnected except by means of the base portions 18. The tines 20 and 22 with one of the bridges 30 form one tine array, and the tines 24 and 26 with the other bridge 30 form a second tine array. The two arrays are similar to one another and extend side by side between the base portions 18.

Preferably, the body portion 12 is symmetrical about its horizonal and vertical centerlines, as viewed in FIG. 1. Each of the four tines 20-26 has the same cross section, and each of the three slots 28 is the same width. Bridge portions 30 are preferably located in the middle of the lengths of the tines. However, other arrangements are possible, and the bridge portions 30 could be located to subdivide the tine lengths into smaller segments each equal in length to one another. Electrical contact pads 32 are located upon the end sections 14 to permit the resonator 10 to be electrically connected to an oscillator circuit. Conductive paths 34 interconnect the pads 32 with electrodes on the tines 20-26.

An array of electrodes 36 and 38 for exciting the resonator 10 is illustrated in FIG. 2. Electrodes 36 of a first relative polarity and electrodes 38 of the opposite polarity are applied to the tines 20-26 by a suitable metallization process. Electrodes 36 are electrically isolated from electrodes 38. To visually differentiate polarities in the drawing, electrodes 36 are shown with horizontal shading and electrodes 38 are shown with vertical shading.

Each tine 20-26 has two side-by-side rows of electrodes 36 and 38 along its length. In the embodiment of FIG. 2, each tine has five pairs of electrodes 36 and 38 disposed along the length of each major surface, with the lengths of the three centrally-located pairs being equal to each other and twice the length of the pairs located at the ends. The electrodes 36 alternate with the electrodes 38 along the length and across the width of each tine. In each tine array, each electrode 36 and 38 on one tine is beside a like electrode on the other tine. The arrays of electrodes 36 and 38 are oppositely disposed about the major longitudinal centerline of the tine system 16 and the electrode patterns on tines 20 and 26 are alike, while the electrode patterns on tines 22 and 24 are like one another and are the reverse of the pattern on tines 20 an 26.

The electrodes 36 and 38 are applied only to the two major faces or surfaces of the tines 20-26. The term "major surfaces" refers to the two surfaces that existed on the faces of the planar stock before cutting of the body 12 out of the stock. Each tine has two major surfaces and two side surfaces formed when the body 12 is cut from the planar stock. Electrodes are not formed on the side surfaces. The surface opposite to that seen in FIG. 2 has an array of electrodes 36 and 38 opposite to the array seen in FIG. 2 arranged so that each electrode 36 or 38 is opposite an opposite polarity electrode 38 or 36, respectively, on the opposite face of the body 12. The electrodes 36 are interconnected by conductive traces 39 as are the electrodes 38, and both polarities are connected to selected ones of the conductive pads 32 by selected ones of the conductive traces 34. The interconnecting traces 39 along the tines 20-26 may cross over on the major surfaces as shown in FIG. 2 or may cross the side surfaces, as will be subsequently discussed in conjunction with FIGS. 10 and 11.

The body 12 is made of a crystalline material exhibiting a piezoelectric characteristic, such as a quartz crystal. Resonant vibratory motion is caused by voltage gradients resulting from the application of alternating voltage potentials to the electrodes 36 and 38. The location of the electrodes excites the tine system to vibrate at a resonant frequency in a complex dynamic mode including a combination of two types of motion. One of the combined components is torsional or twisting motion. The other combined component is movement in a direction normal to the plane of the stock from which the body 12 is cut.

The body 12 may be made of a different material such as silicon rather than a quartz crystal. In this case, a different but equivalent electrode arrangement may be used, with electrodes spaced slightly from at least one face of the body 12 rather than being mounted on surfaces of the body 12. Tines of a silicon body may be driven electrostatically or electromagnetically rather than by piezoelectric action.

The dynamic mode achieved with the resonator 10 may be best understood with reference to FIGS. 4-9. FIGS. 4 and 5 are enlarged sectional views through the midpoint and quarter length point, respectively, of the tine system 16 and show the tines 20-26 at rest. Each of the tines 20-26 and bridge portions 30 lies initially in the plane of the stock from which the body 12 is cut.

FIGS. 6 and 8 show the torsional component of the dynamic mode of the resonator 10. The bridges 30 join the adjacent tines 20-22 and 24-26 at the midpoints of the tines so that the midpoints of the joined tines cannot move independently of one another. The result, when the tine system 16 resonates, is that the bridge portions 30 and adjacent portions of the tines rotate as a unit around a fixed axis indicated by the marks 40. FIGS. 6 and 8 show two complementary points during a periodic resonant vibration in which the tine midpoints and bridge portions are rotated around the axes 40 in different directions from the in-plane position of FIG. 4. Each axis 40 is parallel to the direction of the tines and is located at the center of the thickness of the stock.

FIGS. 5, 7 and 9 show the positions of the tines 20-26 at a point one quarter of the way along their length. The illustrations would be identical at both of the quarter length positions. FIGS. 6 and 7 show different parts of the tine system 16 at the same time, and FIGS. 8 and 9 show other parts at a complementary time in the periodic movement. The term "complementary" time or point is used to specify a time or point in the periodic cycle separated by one-half cycle from a reference time or point.

In FIG. 7, each of the tines 20-26 exhibits a torsional movement from the rest position on FIG. 5. The angular degree of torsional motion is less than seen in FIG. 6 because the portions seen in FIG. 7 are closer to a fixed base portion 18. In addition to the torsional component, a component of motion normal to the plane of the stock is also seen in FIG. 7. Tines 20 and 26 are displaced above their initial positions as can be seen by reference to the axes 40. Conversely, the tines 22 and 24 are displaced downwardly. At the complementary position shown in FIG. 9, both the angle of torsional movement and the direction of normal movement are reversed in each tine.

This mode of operation is a higher order mode than the fundamental modes usually excited. Higher order modes result in a higher Q and lower energy loss during operation. Studies have shown the necessary sensitivity to achieve desired frequency shifts can be maintained.

FIG. 3 illustrates in simplified schematic fashion the use of the resonator 10 in an accelerometer. One end of the resonator 10 is attached to a relatively fixed support 42 and the other end is fixed to a relatively free proof mass 44. When the system including the proof mass 44 is subjected to positive or negative acceleration in the direction of the tines 20-26 and the axes 40, the resonant frequency of the resonator 10 varies accordingly. The resonator 10 is coupled into the feedback circuit of an electronic oscillator to control the frequency of oscillation. Oscillation frequency changes are detected to provide an output signal corresponding to the detected acceleration.

Balancing of forces within the tine system 16 results from the use of the two tine arrays 20-22 and 24-26 moving in equal and opposite torsional and normal directions. During resonant vibration, the central structures seen in FIGS. 4, 6 and 8 continuously twist back and forth around the axes 40 out of phase with one another. Similarly, the other parts of the tine arrays move with both torsional and normal motion components out of phase with one another. Counterbalancing equal and opposite forces are coupled between the tine arrays through the base portions 18 in order to minimize the application of unbalanced reaction forces to the supporting end sections 14. The design is capable of withstanding relatively large applied axial forces, and internal stresses are minimized. Manufacturing processes are simplified by the fact that electrodes are not required on side surfaces of the tines 20-26 and the body 12 is easier to make than a three beam device.

As stated previously in conjunction with the description of FIG. 2, the interconnecting conductive traces 39 that interconnect the electrodes 36 and 38 may cross over on the major surfaces as shown in FIG. 2 or may cross the side surfaces of the tines. An embodiment wherein the interconnecting conductive traces cross the side surfaces is illustrated in FIGS. 10 and 11. FIG. 10 illustrates a four-tine resonant structure having four tines 20', 22', 24' and 26' that are analogous to the tines 20, 22, 24 and 26 of FIG. 2. Disposed on each of the tines 20', 22', 24' and 26' are opposite polarity electrodes 36' and 38' analogous to the electrodes 36 and 38 of FIG. 2. One pair of the electrodes 36' and 38' are shown in greater detail in FIG. 11. Only a single pair of electrodes is shown in FIG. 11 for purposes of clarity, but it should be understood that a second pair are disposed on the opposite side of the tine to provide a total of four electrodes as partially shown in FIG. 10. The electrodes 36' and 38' of FIGS. 10 and 11 are disposed along the lengths of the tines in a manner similar to the electrodes 36 and 38 of FIG. 2; however, rather than being interconnected by the interconnecting conductive traces 39 of FIG. 2 that cross over on a major surface, each electrode 36' and 38' of FIG. 10 is wrapped around each of the tines in a "barber pole" fashion to provide the electrode pattern shown in FIGS. 10 and 11.

More specifically, referring to the bottom-most end of the tine 26' the electrode 36' is positioned to the left of the electrode 38'. Proceeding upwardly from the bottom of the tine 26' to a point 50, the electrode 36' shifts to the right while the electrode 38' is folded downwardly to the opposite major surface of the tine 26' while another electrode 38' is folded upwardly from the lower major surface of the tine 26' and positioned to the left of the shifted electrode 36'. Thus, between the point 50 and a point 52, the electrode 38' is now to the left of the electrode 36'. On the opposite major surface, the electrode 36' is beneath the electrode 38' and the electrode 38' is beneath the electrode 36'. At the point 52, the electrode 38' is shifted to the right and the electrodes 36' are wrapped around to the opposite major surfaces again to reverse the positions of the electrodes 36' and 38' on both major surfaces between the point 52 and a point 54. The shifting and wrapping process is again repeated at the point 54 and a point 56 to again reverse the positions of the electrodes. The same technique is used on each of the other tines 20', 22' and 24' to provide an alternating electrode pattern similar to that illustrated in FIG. 2.

While it was stated previously that the present invention has the advantage that the electrodes are positioned only on the major surfaces of the tines, thereby permitting easier fabrication, the embodiment shown in FIGS. 10 and 11 is also readily fabricated. This is because only the relatively small cross-over portions need to be fabricated on the edges of the tine, rather than entire electrodes. Also, the embodiment illustrated in FIGS. 10 and 11 has the advantage that the interconnecting traces or cross-over points are inherently insulated from each other by the tine and no additional provisions need be made to insulate the interconnecting traces from each other as is the case of the interconnecting traces 39 of FIG. 2.

Another embodiment illustrated in FIG. 12 utilizes a four-tine resonant structure comprising tines 20'', 22'', 24'' and 26'', analogous to tines 20, 22, 24 and 26 of FIG. 2. In the embodiment of FIG. 12, the tines are excited by electrodes 36'' and 38'' analogous to the electrodes 36 and 38 of FIG. 2. In the embodiment of FIG. 12, the electrodes 36 and 38 are not reversed along the length of any of the tines, but the electrodes 36'' and 38'' are positioned in opposite order on the tines 20'' and 22'' as in the case of FIG. 2. The electrodes on the tine 24'' are positioned like those of the tine 22'' and the electrodes on the tine 26'' are positioned like those on the tine 20''.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A vibrating tine resonator for use as a transducer or the like, said resonator comprising:
a unitary body cut from flat, planar crystalline stock and having a generally uniform thickness;
said body including spaced apart end portions; and
said body including a tine system extending between said end portions;
said vibrating tine resonator being characterized by:
said tine system including a pair of similar tine arrays extending side-by-side between said end portions;
each array including a pair of tines extending parallel to one another and defining a slot separating said pair of tines; and
each array including a unsupported bridge portion spanning said slot and joining said tines.

2. A vibrating tine resonator as claimed in claim 1, each said bridge portion being located at the midpoints of said tines.

3. A vibrating tine resonator as claimed in claim 1, each said bridge portion being located at a point along said tines defined by the fraction 1/n where 1 is the length of the tines and n is an integer.

4. A vibrating tine resonator as claimed in claim 1, wherein there are only two of said arrays.

5. A vibrating tine resonator as claimed in claim 1, wherein said arrays are coupled to one another only by connections of said tines to said body at the ends of said tines.

6. A vibrating tine resonator as claimed in claim 1, further comprising means for exciting said tines to vibrate in a dynamic mode including a torsional component.

7. A vibrating tine resonator as claimed in claim 1, further comprising means for exciting said tines to vibrate in a dynamic mode including a torsional component and a component normal to the plane of said stock.

8. A vibrating tine resonator as claimed in claim 6, wherein said exciting means comprises electrodes coupled to said tines.

9. A vibrating tine resonator as claimed in claim 8, wherein said electrodes are metallized areas on the surfaces of said tines.

10. A vibrating tine resonator as claimed in claim 9, wherein said electrodes are located substantially only on the major surfaces of said tines.

11. A method of vibrating the resonator claimed in claim 1 comprising the step of exciting the resonator to vibrate with a dynamic mode having a torsional component.

12. A method of vibrating the resonator claimed in claim 1 comprising the step of exciting the resonator to vibrate with a dynamic mode having a torsional component and a component normal to the plane of said stock.

13. A vibrating tine resonator for use as a transducer or the like, said resonator comprising:
a unitary body cut from flat, planar crystalline stock and having a generally uniform thickness;
said body including spaced apart end portions; and
said body including a tine system extending between said end portions;
said vibrating tine resonator being characterized by:
said tine system including a pair of similar tine arrays extending side-by-side between said end portions;
each array including a pair of tines extending parallel to one another and defining a slot separating said pair of tines;
each array including a bridge portion spanning said slot and joining said tines;
means for exciting said tines to vibrate in a dynamic mode including a torsional component;
wherein said exciting means comprises electrodes coupled to said tine, wherein said electrodes are metallized areas on the surfaces of said tines, wherein said electrodes are located substantially only on the major surfaces of said tines, and wherein said electrodes comprise a pair of electrodes disposed in a parallel relationship on each of the major surfaces of said tines.

14. A vibrating tine resonator as claimed in claim 13, wherein said electrodes cross over each other along the length of said tines.

15. A vibrating tine resonator as claimed in claim 13, wherein said electrodes wind around said tines.

16. A vibrating tine resonator comprising:
a body of crystalline material made from flat planar stock;

said body including a pair of end portions and a pair of tines extending generally parallel to one another between said end portions;

an unsupported bridge portion extending between the tines of said pair;

means for exciting said tines to vibrate in a dynamic mode in which said bridge portion pivots around an axis that is in the plane of the stock and is parallel to said tines and in which said tines move normal to the plane of said stock.

17. The resonator of claim 16, wherein said means for exciting comprises electrode means coupled to said tines.

18. The resonator of claim 16, wherein said electrode means include an array of electrodes with two opposite polarities.

19. The resonator of claim 18, wherein said array of electrodes is formed in a layer of metal on surfaces of said tines.

20. The resonator of claim 19, wherein said array of electrodes is formed substantially only on the two major surfaces of each tine.

21. A vibrating tine resonator comprising:

a body of crystalline material made from flat planar stock;

said body including a pair of end portions and a pair of tines extending generally parallel to one another between said end portions;

a bridge portion extending between the tines of said pair;

means for exciting said tines to vibrate in a dynamic mode in which said bridge portion pivots around an axis that is in the plane of the stock and is parallel to said tines and in which said tines move normal to the plane of said stock;

wherein said electrode means includes an array of electrodes with two opposite polarities, wherein said array of electrodes is formed in a layer of metal on the surfaces of said tines, wherein said array of electrodes is formed substantially only on the two major surfaces of each tine, and wherein said electrodes comprise a pair of electrodes disposed in a parallel relationship on each of the major surfaces of said tines.

22. A vibrating tine resonator as claimed in claim 21, wherein said electrodes cross over each other along the length of said tines.

23. A vibrating tine resonator as claimed in claim 21, wherein said electrodes wind around said tines.

24. A method for vibrating a resonator of the type having a pair of tines extending between end portions of a flat planar crystalline body and having a bridge portion interconnecting the tines at a location between the ends of the tines, said method comprising the steps of:

(a) providing excitation to said tines; and (b) pivoting the bridge portion about a pivot axis that is parallel with the tines.

25. A method for vibrating a resonator of the type having a pair of tines extending between end portions of a flat planar cyrstalline body and having a bridge portion interconnecting the tines at a location between the ends of the tines, said method comprising the steps of:

(a) pivoting the bridge portion about a pivot axis that is parallel with the tines; and (b) moving said tines in directions normal to the flat plane of the cyrstalline body.

* * * * *